(12) United States Patent
Nakajima et al.

(10) Patent No.: US 6,888,160 B1
(45) Date of Patent: May 3, 2005

(54) SEMICONDUCTOR DEVICE AND FABRICATION METHOD THEREOF

(75) Inventors: Setsuo Nakajima, Kanagawa (JP); Takeshi Fukunaga, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 09/165,975

(22) Filed: Oct. 2, 1998

(30) Foreign Application Priority Data

Oct. 7, 1997 (JP) .............................................. 9-290316

(51) Int. Cl.⁷ ...................... H01L 29/04; H01L 31/036; H01L 31/0376
(52) U.S. Cl. .............................. 257/59; 257/66; 257/72
(58) Field of Search ............................. 257/59, 72, 66, 257/344, 351, 350, 347, 408, 336, 60, 61; 438/151, 153, 154, 155, 158, 161, 163, 180; 349/42, 43

(56) References Cited

U.S. PATENT DOCUMENTS

| | | | | | |
|---|---|---|---|---|---|
| 5,032,883 A | * | 7/1991 | Wakai et al. | .................. | 257/59 |
| 5,198,379 A | * | 3/1993 | Adan | .......................... | 438/151 |
| 5,264,728 A | * | 11/1993 | Ikeda et al. | .................. | 257/761 |
| 5,348,897 A | * | 9/1994 | Yen | ............................. | 438/152 |
| 5,397,718 A | * | 3/1995 | Furuta et al. | ............... | 438/158 |
| 5,508,216 A | * | 4/1996 | Inoue | .......................... | 438/151 |
| 5,595,944 A | * | 1/1997 | Zhang et al. | ................ | 438/158 |
| 5,612,235 A | * | 3/1997 | Wu et al. | .................... | 438/158 |
| 5,808,595 A | * | 9/1998 | Kubota et al. | ................ | 345/92 |
| 5,859,445 A | * | 1/1999 | Yamazaki | ..................... | 257/66 |
| 5,891,766 A | * | 4/1999 | Yamazaki et al. | .......... | 438/163 |
| 5,903,014 A | * | 5/1999 | Ino et al. | ...................... | 257/66 |
| 5,913,111 A | * | 6/1999 | Kataoka et al. | ............. | 438/163 |
| 5,955,765 A | * | 9/1999 | Yamazaki et al. | .......... | 257/365 |
| 5,986,724 A | * | 11/1999 | Akiyama et al. | ............. | 349/41 |
| 6,028,325 A | * | 2/2000 | Yamazaki | ..................... | 257/66 |

FOREIGN PATENT DOCUMENTS

| | | | | | |
|---|---|---|---|---|---|
| JP | 5-95002 | * | 4/1993 | ................. | 438/158 |
| JP | 07/130652 | | 5/1995 | | |
| JP | 08/015686 | | 1/1996 | | |

* cited by examiner

Primary Examiner—Shouxiang Hu
(74) Attorney, Agent, or Firm—Cook, Alex, McFarron, Manzo, Cummings & Mehler, Ltd.

(57) ABSTRACT

To provide a technology for fabricating a bottom gate type TFT by steps having high mass production performance, an insulating film whose major component is silicon is formed on an active layer, the insulating film is patterned and openings are formed at portions thereof constituting source and drain regions at later steps, a resist is provided right above a portion for forming a channel forming region at later steps, a step of adding an impurity is carried out and in this case, the patterned insulating film is utilized as a doping mask.

80 Claims, 5 Drawing Sheets

SEMICONDUCTOR DEVICE AND FABRICATION METHOD THEREOF

BACKGROUND OF THE INVENTION

1. Field of the Invention

The present invention relates to a thin film transistor (hereinafter, abbreviated as TFT) of a bottom gate type which is fabricated by utilizing a semiconductor thin film.

2. Description of Related Art

Currently, a liquid crystal display device (hereinafter, abbreviated as LCD) is utilized as the display for notebook personal computers or portable information terminals. In the past, a passive type LCD was mainly used. However, with requests for highly fine images becoming more enhanced, an active matrix type LCD has become the main stream.

An active matrix type LCD is provided with a plurality of TFTs arranged in a matrix in a display unit thereof. Voltage control is carried out at each pixel with a TFT as a switching element by which the desired image is realized. An inverted stagger type TFT using amorphous silicon for an active layer has been frequently utilized.

For such an inverted stagger type TFT using amorphous silicon, the following advantages are realized: simple fabrication steps, high throughput, excellent yield and the like. However, the carrier mobility of amorphous silicon is small, and accordingly, requested electric properties are provided by enlarging the size of the individual TFT.

However, currently, the size of TFT is required to be in order to realize a highly fine image display. Situations in which electric properties capable of meeting the request are very difficult to provide in the case of amorphous silicon.

Hence, in recent years, an inverted stagger type TFT using polysilicon for an active layer has attracted attention, and keen competition for development thereof has been carried out. In recent times, while active matrix type LCDs each constituted by an inverted stagger type TFT using polysilicon are found in the market, the product is regarded to still be in a developing stage.

SUMMARY OF THE INVENTION

One of the objects of the present invention is to provide a technology for fabricating a bottom gate type TFT by steps having high mass production performance.

One embodiment of the present invention, directed to is a semiconductor device having a semiconductor circuit comprising a plurality of TFTs on an insulating surface, wherein the plurality of TFTs include an active layer comprising a semiconductor thin film and an insulating silicon film covering at least the channel forming regions and end portions of the active layer, and wherein impurities providing an N-type and/or a P-type conductivity are included in either a portion or the entire area of the insulating silicon film.

Further, another aspect of the present invention, is directed to a semiconductor device having a semiconductor circuit comprising a plurality of TFTs on a substrate having an insulating surface, wherein the plurality of TFTs include an active layer comprising a semiconductor thin film and an insulating silicon film covering at least the channel forming regions and LDD regions of the active layer; and wherein impurities providing an N-type and/or a P-type conductivity are included in a portion of the insulating silicon film.

Further, in the above-described constitutions, the portion of the insulating silicon film with impurities can be located anywhere except at a region right above the channel forming region. That is, a resist mask is provided on the channel forming region and accordingly, the impurities are not included in the channel forming region.

Further, another aspect of the present invention is directed to a semiconductor device having a semiconductor circuit comprising a plurality of TFTs on an insulating surface, wherein the plurality of TFTs have an active layer comprising a semiconductor thin film and an insulating silicon film covering at least a channel forming region and end portions of the active layer, wherein a source region and a drain region of the active layer comprise regions including impurities providing an N-type and/or a P-type conductivity, and wherein the source region and the drain region of the active layer is surrounded by regions having the same conductive type as the source region and the drain region and including impurities having a concentration lower than the concentration in the source region and the drain region.

Further another aspect of the present invention is directed to a method of fabricating a semiconductor device including a semiconductor circuit comprising a plurality of TFTs formed on an insulating surface, the method comprising the steps of, forming an active layer comprising a semiconductor thin film; forming an insulating silicon film on the active layer; patterning the insulating silicon film and selectively removing portions of the insulating silicon film disposed above regions constituting a source and a drain; and forming a resist mask selectively on the insulating silicon film; adding impurities providing an N-type and/or a P-type conductivity, wherein the insulating silicon film is utilized as a doping mask for forming LDD regions and the LDD regions are formed under the insulating silicon film.

In the step in adding the impurities of the above-described constitution, impurities providing the N-type and/or the P-type conductivity are added under the insulating silicon film which is exposed with a concentration the same as a concentration of the LDD regions. The impurities are added to the LDD regions through the insulating silicon film.

Further, another aspect of the present invention is directed to a method of fabricating a semiconductor device including a semiconductor circuit comprising a plurality of TFTs formed on an insulating surface; the method comprising the steps of: forming an active layer comprising a semiconductor thin film; forming an insulating silicon film on the active layer; patterning the insulating silicon film and selectively removing portions of the insulating silicon film disposed above the regions constituting a source and a drain in later steps; adding impurities providing an N-type and/or a P-type conductivity, wherein in the step of adding the impurities, a channel forming region, a source region and a drain region are self-aligningly formed with the insulating silicon film as a doping mask.

Further, in the step of patterning the insulating silicon film in the above-described constitution, sometimes the insulating silicon film remains at the end portions of the active layer so as to cover the end portions. As discussed infra, the constitution wherein the insulating silicon film remains at the end portions of the active layer in this way, significantly contributes to simplifying the steps of fabricating TFT.

DETAILED DESCRIPTION OF THE PREFERRED EMBODIMENTS

Figure 1A:
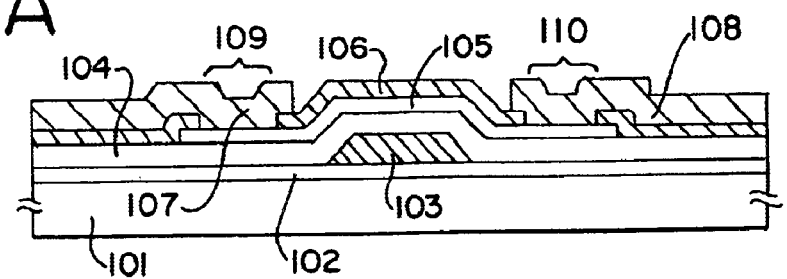
FIGS. 1A and 1B are views showing the constitution of TFT utilizing the present invention.
Figure 1B:
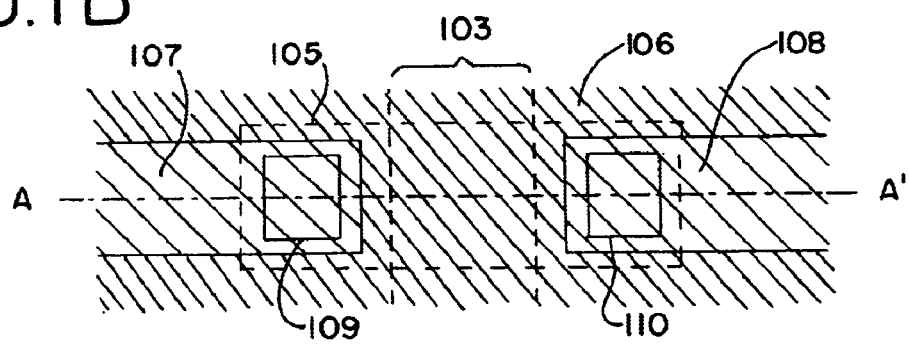

A constitution of the present invention is explained herein in reference to FIGS. 1A and 1B. In FIG. 1A, numeral 101 designates any one of the following: a glass substrate, a quartz substrate, a ceramic substrate or a glass ceramic substrate on which a matrix film 102 comprising a silicon oxide film, a silicon nitride film, a silicon oxynitride film (represented by $SiO_xN_y$) or a laminated layer film of these films.

Incidentally, an insulating film constituted by coupling silicon with another element (e.g. oxygen, nitrogen or the like) as in a silicon oxide film, a silicon nitride film or a silicon oxynitride film or a laminated layer film constituted by these insulating films is referred to as an insulating silicon film in this specification.

Next, a gate electrode 103 is provided on the matrix film 102. As the gate electrode 103, a thin film, whose major component is aluminum, tantalum, molybdenum, tungsten or chromium or a laminated layer film of these components can be used. Alternatively, a constitution in which an anodized film is provided on the surface of the gate electrode 103 may be formed.

A gate insulating film 104 comprising an insulating silicon film is formed thereon, and an active layer 105 is provided thereon. The active layer 105 is constituted by a crystalline semiconductor thin film (representatively, polysilicon film) or an amorphous semiconductor thin film (representatively, amorphous silicon film).

Next, an insulating silicon film 106 is provided to cover at least a channel forming region of the active layer 105. Considering the passivation effect of the active layer 105, a silicon nitride film which is highly moisture resistance is appropriate as the insulating silicon film 106. Further, it is one of characteristics of the present invention that end portions of the active layer 105 are covered by the insulating silicon film in FIG. 1A. A detailed explanation will be given of the advantages in Embodiment 1.

Thereafter, source and drain regions are formed by adding impurities providing N-type and P-type conductivity, and thereafter, a source electrode 107 and a drain electrode 108 are provided on the insulating silicon film 106.

As the source and drain electrodes 107 and 108, a thin film, whose major component is aluminum and a laminated layer film of a thin film whose major component is aluminum and a titanium film and so on, can be used. The source and drain electrodes 107 and 108 are electrically connected to a source region and a drain region, both formed in the active layer via opening portions (contact holes) 109 and 110.

In this embodiment, FIG. 1B is a top view of FIG. 1A. Further, a section taken along a line A-A' of FIG. 1B corresponds to FIG. 1A. Further, notations used in explaining FIG. 1A are also used in FIG. 1B.

The characteristic of the present invention resides in the effect of the insulating silicon film 106. According to the present invention, the insulating silicon film 106 is provided with the effects enumerated below.

(1) The insulating silicon film 106 functions as a doping mask in the steps of adding impurities.

(2) The insulating silicon film 106 prevents stepped disconnection of the source and the drain electrodes at end portions of the active layer.

(3) The insulating silicon film 106 protects the TFT (particularly, the channel forming region).

A detailed explanation will be given of the constitution and effect mentioned above in the embodiments described below.

[Embodiment 1]

In this embodiment, an explanation will be given of an example of steps for forming the plurality of bottom gate type TFTs on a same substrate and forming a driver circuit unit and a pixel matrix circuit unit of an active matrix type LCD, in reference to FIGS. 3A to 3E. Further, as the driver circuit unit, a CMOS (Complementary Metal Oxide Semiconductor) circuit in which NTFT and PTFT are complimentarily integrated is shown, and as the pixel matrix circuit unit, pixel TFT comprising NTFT is shown.

First, a glass substrate 301 is prepared and a underlayer film 302 comprising a silicon oxide film having a thickness of 200 nm is formed thereon. On top thereof, gate electrodes 303 through 305 each comprising a laminated layer film comprising tantalum and tantalum nitride (Ta/TaN) are formed. Further, each of the gate electrodes 303 through 305 may be formed with an anodized film on its surface by an anodizing step.

Next, a gate insulating film 306 covering the gate electrodes 303 through 305 is formed. In this embodiment, as the gate insulating film 306, a laminated layer film, comprising a silicon nitride film having a thickness of 50 nm and a silicon oxynitride film having a thickness of 250 mm, is used. These may be formed by a plasm CVD (Chemical Vapor Deposition) process or a low pressure thermal CVD process.

Next, a semiconductor thin film (crystalline semiconductor thin film) 307 having a crystal structure is formed. In this embodiment, a crystalline silicon film is used as the crystalline semiconductor thin film. Further, a compound of silicon and germanium represented by $Si_xGe_{1-x}$ (0<X<1) can also be used as the semiconductor thin film.

The crystalline silicon film 307 may be formed by a publicly-known means, such as for example, by crystallizing an amorphous silicon film. Means for crystallizing an amorphous silicon film may be constituted by furnace annealing (heat treatment in an electric furnace), laser annealing (heat treatment by laser beam), lamp annealing (heat treatment by strong beam) or the like.

In this embodiment, laser annealing all over the substrate is carried out by processing with a KrF excimer laser of a pulse oscillation type in a linear shape and by scanning the linear beam from one end to other end of the substrate. In this example, the frequency of oscillation is set to 30 MHz, the scanning speed is set to 2.4 mm/s, the laser energy is set to 320 mJ/cm², and treatment temperature is set to room temperature.

Further, when furnace annealing is used, it is preferable to utilize a technology described in Japanese Unexamined Patent Publication No. JP-A-7-130652 by the inventors. The disclosure is incorporated herein by reference. When the technology described in the publication is used, a crystallizing step is finished by furnace annealing at 550iC for about 4 hours. Further, when laser beam is irradiated after the crystallizing step, crystallization of an amorphous component, reduction in intragrain defects and so on are carried out, and the crystallinity is significantly improved.

Figure 3A:
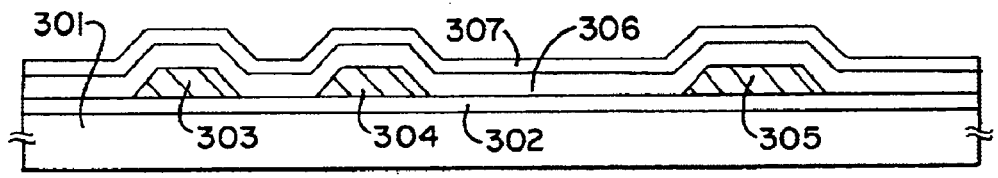
FIGS. 3A to 3E are views showing fabrication steps of TFT according to Embodiment 1 in the present invention.

In this way, the state of FIG. 3A is provided. Next, the provided crystalline silicon film 307 is patterned so that an active layer 308 of a CMOS circuit (in this embodiment, drain regions of NTFT and PTFT are made common) and an active layer 309 of the pixel TFT are formed. Thereafter, an insulating silicon film 310 is the most important constitution of the present invention and in this embodiment, it is formed using a silicon nitride film.

The silicon nitride film 310 is provided with opening portions 311 through 315 for electrically connecting source and drain electrodes to be formed later with the active layers 308 and 309. Further, in this embodiment, the silicon nitride film 310 is formed such that end portions of the active layers 308 and 309 are covered to conceal. An explanation will be given thereof in reference to FIG. 4.

Figure 4:
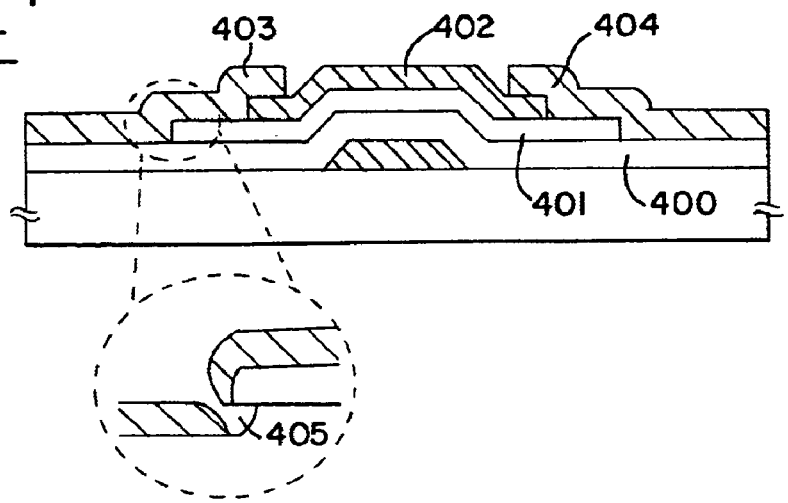
FIG. 4 is a view showing the constitution of a conventional TFT.

In FIG. 4, numeral 400 designates a gate insulating film, numeral 401 designates an active layer, numeral 402 designates an insulating silicon film (silicon nitride film), numeral 403 designates a source electrode, and numeral 404 designates a drain electrode FIG. 4 shows the problem posed in the case where an end portion of the active layer 401 is formed such that it is not covered by the silicon nitride film 402.

In the case of the constitution shown by FIG. 4, first, the silicon nitride film 402 is formed, and thereafter, the patterning operation is carried out. In this example, when the etching operation has been finished, the gate insulating film 400 is overetched, and a hollowed portion 405 is produced at an end portion of the active layer 401. Accordingly, disconnection failure is caused owing to the hollowed portion 405.

In order to prevent this, an interlayer insulating is formed, and source and drain electrodes are formed thereon. However, in such a case, a step of forming interlayer film and a step of patterning contact holes have to be added.

Figure 3B:
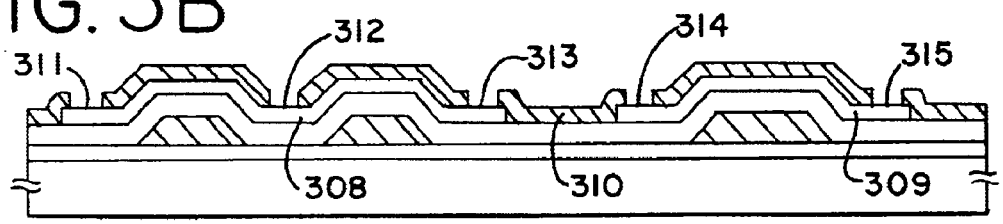

Hence, according to this embodiment, as shown by FIG. 3B, the silicon nitride film 310 is formed to cover end portions of the active layers 308 and 309 by which hollowed portions are prevented from causing at end portions of the active layers 308 and 309. Further, end portions of an active layer indicate an outer edge of the active layer, and as shown by FIG. 3B, all of the end portions are covered or concealed by the silicon nitride film 310.

In this embodiment, by devising the structure in such a way, source and drain electrodes are formed without forming an extra interlayer insulating film, and simplification of steps is realized. A description thereof will be given later.

When the state of FIG. 3B has been provided in this way, after forming resist masks 316 through 318, an impurity providing N-type conductivity (phosphorus in this embodiment) is added by an ion implantation process (with mass separation) or an ion doping process (without mass separation). In this embodiment, the process is carried out by dividing it in to two adding steps.

First, the acceleration voltage is elevated to 80 keV and phosphorus is added by a dose amount of $1 \times 10^{13}$ ions/cm$^2$. In this case, the acceleration voltage is so high that the silicon nitride film 310 does not function as a mask. Next, the acceleration voltage is lowered to 10 keV, and phosphorus is added by a dose amount of $5 \times 10^{14}$ ions/cm$^2$. In this case, the silicon nitride film 310 functions as a doping mask, and phosphorus is not added thereunder.

By the phosphorus adding step, a source region 319, a drain region 320, low concentration impurity regions (LDD (Lightly Doped Drain) regions) 321, and a channel forming region 322 constituting NTFT of the CMOS circuit are formed. Further, at the same time, a source region 323, a drain region 324, LDD regions 325, and a channel forming region 326 of pixel TFT (NTFT) are formed. (FIG. 3C).

In this case, regions added with phosphorus through the silicon nitride film 310 include phosphorus at a concentration lower than those of the source and drain regions (impurity concentration is about $1 \times 10^{21}$ atoms/cm$^3$) to constitute LDD regions (impurity concentration is about $1 \times 10^{17}$ through $1 \times 10^{18}$ atoms/cm$^3$). Further, when the second ion adding step is not carried out, in place of LDD regions, offset regions can be formed.

Further, no impurity is added right under the regions provided with the resist masks 317 and 318, and an intrinsic or a substantially intrinsic channel forming region is constituted. "Substantially intrinsic" indicates that the concentration of an impurity for providing N-type or P-type conductivity is equal to or lower than $1 \times 10^{17}$ atoms/cm.

Figure 2A:
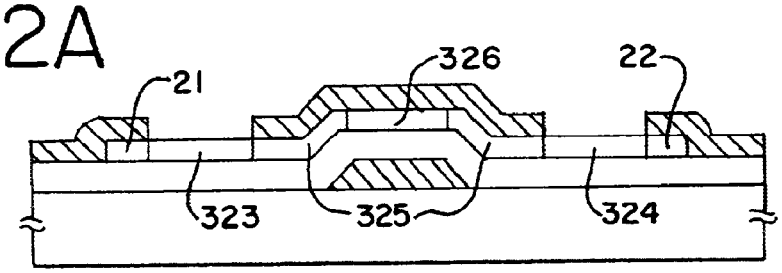
FIGS. 2A to 2C are views showing the constitution of TFT according to Embodiment 1 in the present invention.
Figure 2B:
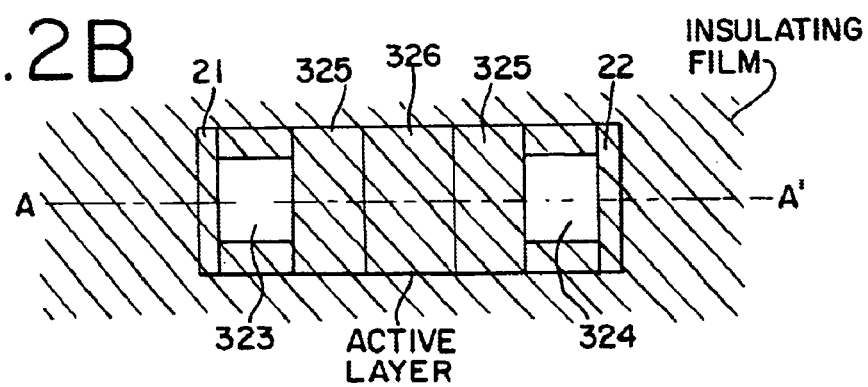
Figure 2C:
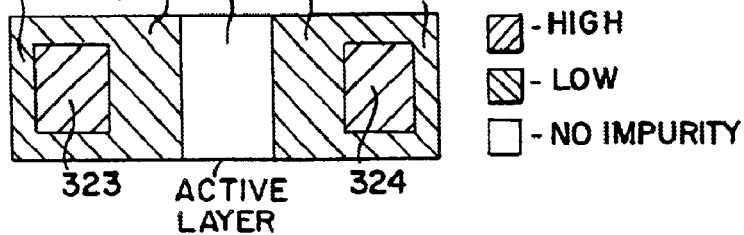
Figure 3C:
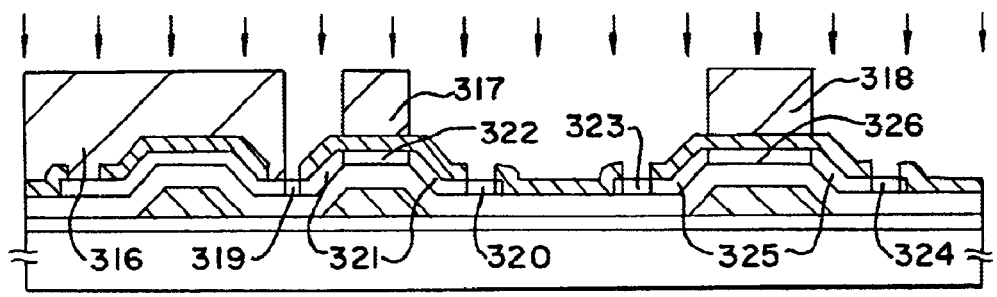

When the adding step has been performed to the pixel TFT shown by FIG. 3C, a constitution shown by FIG. 2 is produced. Further, in FIG. 2, portions the same as those in FIG. 3C are attached with the same notations.

In this case, regions designated by numerals 21 and 22 in FIGS. 2A to 2C are regions disposed under the silicon nitride film covering end portions of the active layer and correspond to outer edge portions of the active layer. The regions 21 and 22 are added with phosphorus through the silicon nitride film and accordingly, phosphorus is added thereto at a concentration the same as that of the LDD regions 325. The hatched region shows the insulating film formed on the active layer. Since the impurities are added through the insulating film, the impurity concentration in the active layer is shown in FIG. 2C, wherein the source and drain regions (323 and 324) are surrounded by regions (325, 21, and 22) having the same conductivity type as the source and drain regions and that the regions (325, 21, and 22) have an impurity concentration lower than the source and drain regions (323 and 324). It is a structural characteristic of the present invention that the source and the drain regions are surrounded by impurity regions having a concentration lower than those of the source and the drain regions in this way.

When the step of adding phosphorus has been finished in this way, the resist masks 316 through 318 are removed, and resist masks 327 and 328 are again formed. Further, an impurity providing P-type conductivity (boron in this embodiment) is added. Also in this case, similar to the case of phosphorus, the adding step is carried out twice. In the first step, the acceleration voltage is set to 65 keV, and the dose amount is set to $6 \times 10^{13}$ ions/cm$^2$. In the second step, the acceleration voltage is set to 5 keV, and the dose amount is set to $5 \times 10^{14}$ ions/cm$^2$.

By these steps, a source region 329, a drain region 330, LDD regions 331 and a channel forming region 332 constituting PTFT of the CMOS circuit are formed. In this embodiment, the concentration of the impurity in the source and the drain regions is about $5 \times 10^{20}$ atoms/cm$^3$ and the concentration of the impurity in the LDD regions is about $5 \times 10^{16}$ through $5 \times 10^{17}$ atoms/cm$^3$. Further, also in this case, as has been explained in reference to FIG. 2, the source region 329 is surrounded by an impurity region having a concentration the same as that of the LDD region 331.

Further, although in this embodiment, the steps of adding impurity ions are carried out separately in respect of NTFT and PTFT, there may be used means in which phosphorus is firstly added to all of the TFTs, boron is thereafter added to only PTFT at a concentration exceeding the concentration of phosphorus (at least 3 times or more), and the boron added portion is reversed to P-type. Further, in adding phosphorus, a resist mask disposed right above the channel forming region may be formed by using a rear face exposure process.

Further, as mentioned above, the silicon nitride film 310 is utilized as a doping mask, and accordingly, impurities of N-type and/or P-type remain in portions of the silicon nitride film 310 which have been utilized as doping masks. However, the diffusion coefficient of an impurity providing N-type or P-type (representatively, phosphorus or boron) is small in the insulating silicon film, and therefore, no problem is posed.

Figure 3D:
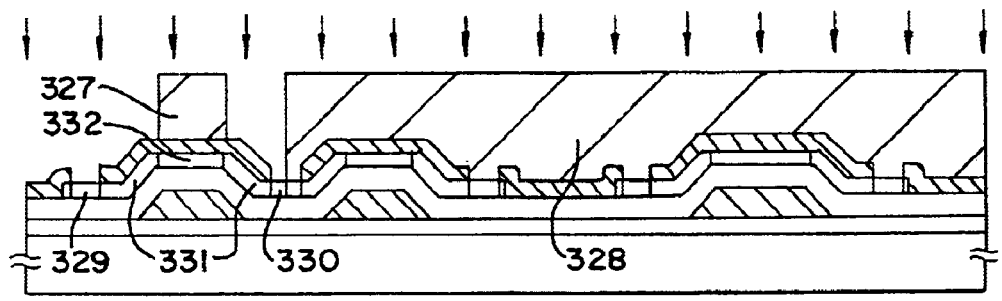

When the state of FIG. 3D has been obtained in this way the resist masks 327 and 328 are removed, and source electrodes 333 and 334 and a common drain electrode 335 of the CMOS circuit and a source electrode 336 and a drain electrode 337 of the pixel TFT are formed. In this embodiment, these electrodes are provided with a structure in which a thin film whose major component is aluminum (Al) which is sandwiched by titanium (Ti) (Ti 150 nm/Al 500 nm/Ti 100 nm).

Figure 3E:
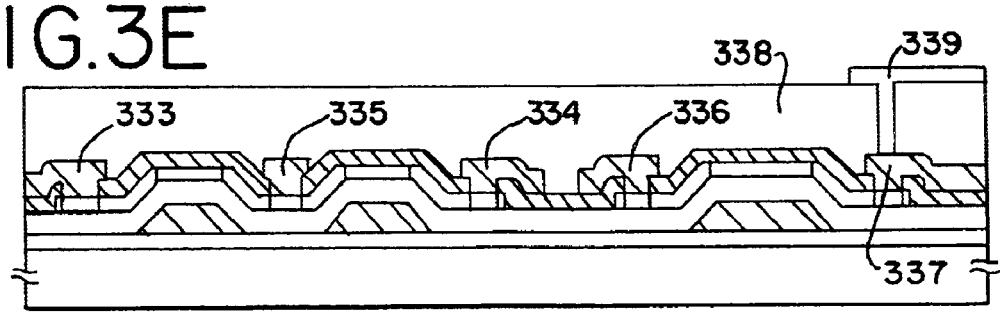

Further, the source and the drain electrodes can be provided by the structure shown by FIG. 3E because the occurrence of hollowed portions at the end portions of the active layers is prevented as mentioned above. Accordingly, in the case of a constitution in which the end portions of the active layers are not covered by the silicon nitride film 310, at this step, a step of forming an interlayer insulating film and a step of forming contact holes must be added.

Next, an interlayer insulating film 338 is formed in a thickness of 0.5 through 2 μm. As the interlayer insulating film 338, an insulating silicon film, an organic resin film or a laminated layer film of these films can be used. Particularly, an organic resin film of polyimide or acrylic resin is preferable since they provide excellent flatness. In that case, the silicon nitride film 310 also provides a function as a protective film for preventing the channel forming region from being brought into direct contact with the organic resin film.

After forming the interlayer insulating film 338, an opening portion is opened, and a pixel electrode 339 is formed. In this embodiment, as the pixel electrode 339, a transparent conductive film (representatively, made of ITO (Indium Tin Oxide), tin oxide or the like) is used. Further, although such a transparent conductive film must be used in the case of a transmission type LCD, when a reflection type LCD is fabricated, the pixel electrode may be constituted by a metal film having high reflectivity. A thin film whose major component is aluminum is preferable.

Finally, heating treatment at 350° C. for about 2 hours is carried out in a hydrogen atmosphere for the whole of TFTs (a hydrogenation step), and the active matrix substrate shown the FIG. 3E is completed. In the active matrix substrate provided by utilizing the present invention, the active layers of the TFTs are covered by the silicon nitride film 310, and accordingly, strong resistance is provided against invasion of moisture, invasion of contaminating ions and the like from outside.

Further, the structure of the TFT in the embodiment is not limited to the description herein. The most important constitution of the present invention resides in that at least a channel forming region of an active layer is covered by an insulating silicon film and the insulating silicon film is utilized as a doping mask and the effects of the present invention can be achieved when such a constitution is provided.

[Embodiment 2]

In Embodiment 1, the step of adding phosphorus and the step of adding boron are carried out separately. However, the addition of phosphorus and boron may be carried out in one adding step. In that case, the acceleration voltage is set to 50 through 70 keV, and the dose amount is set to about $5 \times 10^{14}$ ions/cm².

In this embodiment, regions for constituting source and drain regions are exposed and accordingly, impurities of $1 \times 10^{20}$ atoms/cm³ are added. However, through doping the insulating silicon film is carried out toward portions of an activation region covered with the insulating silicon film and accordingly, the concentration of addition is reduced. Accordingly, the concentration of added impurity is about $1 \times 10^{17}$ through $1 \times 10^{18}$ atoms/cm³ in LDD regions.

In this way, the insulating silicon film provided to cover the active layer also functions as a doping filter. Therefore, when an optimum condition is determined, source and drain regions and LDD regions can be formed in one ion adding step.

[Embodiment 3]

Although in Embodiment 1, the LDD structure is adopted even in the PTFT of the CMOS circuit, the PTFT is provided with low carrier mobility, and accordingly, deterioration thereof does not pose much of a problem. On the contrary, when the LDD structure is so constituted, there may be a case in which lowering of ON current (current which flows when the TFT is brought into an ON state) is caused.

In such a case, it is preferable that only PTFT is not formed with the LDD region. In that case, in patterning the silicon nitride film as shown in FIG. 3B, the silicon nitride film, having a length which substantially coincides with the length of a channel forming region (length in a direction connecting source and drain), is left on the channel forming region of PTFT to be constituted later.

Further, the step of adding boron is carried out with only the silicon nitride film on the channel forming region of PTFT as a doping mask as in the step of FIG. 3D. However, the acceleration voltage is lowered to a degree whereby boron is not diffused in the silicon nitride film. In this way, a channel forming region and source and drain regions are self-aligningly formed, and a constitution, in which only PTFT is not provided with the LDD structure, is provided.

[Embodiment 4]

Figure 5A:
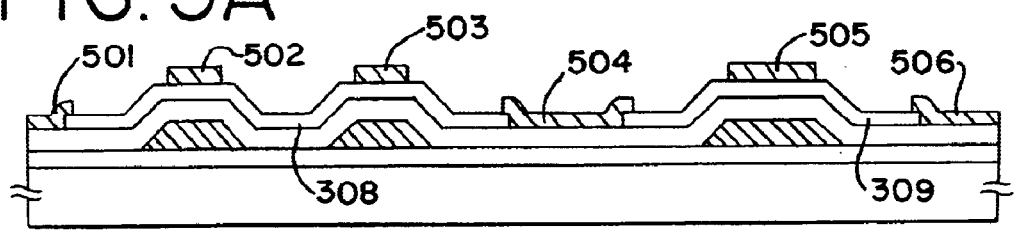
FIGS. 5A to 5C are views showing fabrication steps of TFT according to Embodiment 4 of the present invention.
Figure 5B:
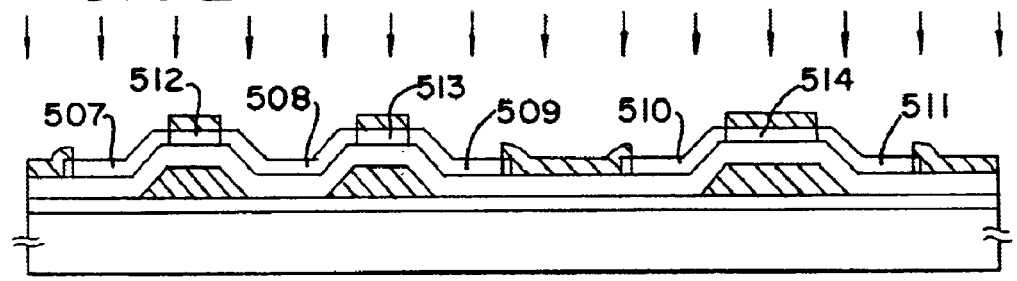
Figure 5C:
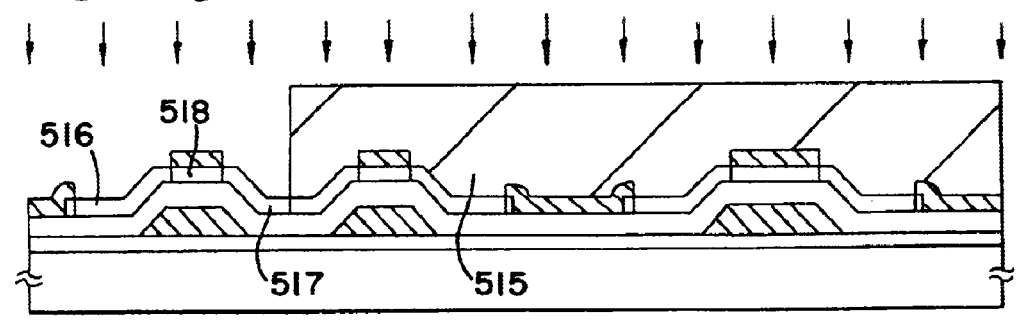

In this embodiment, an example in the case where an active matrix substrate is fabricated by fabrication steps different from those in Embodiment 1 by reference to FIGS. 5A to 5C. Specifically, an example wherein source and drain regions are formed with an insulating silicon film provided on an active layer as a mask is illustrated.

First, the state shown in FIG. 5A is provided in accordance with the fabrication steps of Embodiment 1. In FIG. 5A, numerals 501 through 506 designate an insulating silicon film (silicon oxide film in this embodiment) which are patterned to cover portions for constituting channel forming regions at later steps and end portions of the active layer.

When the state of FIG. 5A is provided, a step of adding phosphorus is carried out by an ion implantation process. In this case, the acceleration voltage is set low to 5 through 10 keV and is adjusted such that the silicon oxide films 501 through 506 completely function as masks. Further, in this case, phosphorus is added into the active layers with a concentration of $1 \times 10^{20}$ through $1 \times 10^{21}$ atoms/cm³.

As a result, regions 507 through 511, including phosphorus at a high concentration, and regions 512 through 514, which do not include phosphorus, are formed. Further, regions which do not include phosphorus are also formed at the end portions of, active layers since the silicon oxide films 501, 504 and 506 constitute masks although an explanation thereof by attaching notations will be omitted.

When the state of FIG. 5B is provided in this way, a resist mask 515 is formed to conceal only a region constituting NTFT, and successively, a step of adding boron is carried out. Also in this step, the acceleration voltage is set low to 5 through 10 keV, and boron is added into the active layer at a concentration of $3 \times 10^{20}$ through $3 \times 10^{21}$ atoms/cm$^3$.

By this step, the conductive type is reversed from N-type to P-type at the regions designated by numerals 507, and 508, and regions 516 and 517 including boron at a high concentration are formed. Also in this case, the region designated by numeral 518 is not added with boron.

By the steps of adding phosphorus and boron mentioned above, source and drain regions and channel forming regions of the TFTs are defined. In other words, regions including phosphorus at a high concentration constitute source regions or drain regions of NTFTs, and regions including boron at a high concentration constitute a source region or a drain region of PTFT. Further, regions, which are not added with either phosphorus or boron, function as channel forming regions.

In this way, by utilizing the insulating silicon film as a doping mask, source and drain regions can be formed by very simple steps. In this case, although the insulating silicon film (silicon oxide film in this embodiment) is left in a state where phosphorus or boron is included, there poses no problem with regard to reliability.

Next, source and drain electrodes are formed, an interlayer insulating film is provided thereon and a pixel electrode is connected to the pixel TFT by which an active matrix substrate is completed. A detailed explanation thereof will be omitted since it has been sufficiently explained supra in Embodiment 1.

Further, although according to the embodiment, a system for reversing only a region for forming PTFT from N-type to P-type (also referred to as counter dope or cross dope) is adopted, a system of separately forming NTFT and PTFT may be adopted as shown in Embodiment 1.

[Embodiment 5]

Although the crystalline semiconductor thin film is utilized as the active layer of the TFT in Embodiment 1, the constitution of the present invention is also applicable in the case where an amorphous semiconductor thin film, is used. A structure referred channel stop type is known in an inverted stagger type TFT using an amorphous semiconductor thin film and the present invention is very effective in such a structure since n$^+$/p$^+$ conductive layers and electrodes get over end portions of the active layers.

[Embodiment 6]

Figure 6A:
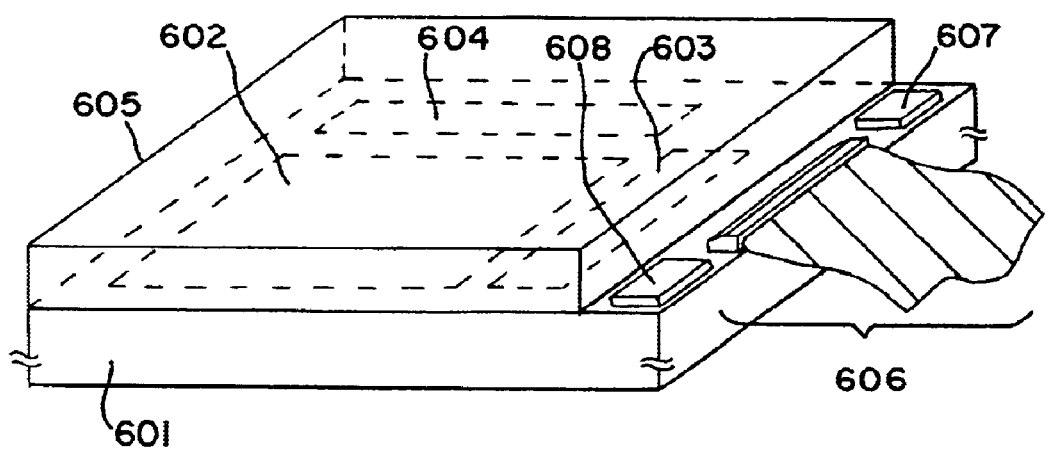
FIGS. 6A and 6B are views showing the constitution of an active matrix type LCD according to Embodiment 5.
Figure 6B:
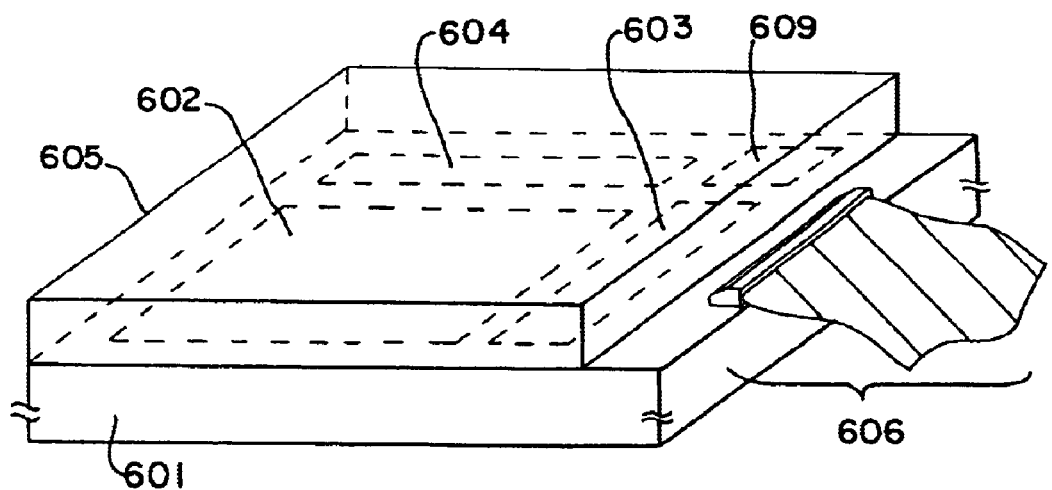

In this embodiment, an explanation will be given of an example in the case where an active matrix type LCD is constituted by using an active matrix substrate having a constitution shown by Embodiments 1 through 5. FIGS. 6A and 6B show the externals of the active matrix type LCD according to the embodiment.

In FIG. 6A, numeral 601 designates an active matrix substrate on which a pixel matrix circuit 602, a source driver circuit 603 and a gate driver circuit 604 are constituted by TFTs according to the present invention. Further, numeral 605 designates an opposed substrate.

In the active matrix type LCD of the embodiment, end faces of the active matrix substrate 601 and the opposed substrate 605 are aligned and pasted together. However, only a portion of the opposed substrate 605 is removed and a FPC (Flexible Print Circuit) 606 is connected to an exposed portion of the active matrix substrate. By the FPC 606, an outside signal is transmitted into the inner circuits.

Further, IC (Integrated Circuit) chips 607 and 608 are attached by utilizing the face attaching the FPC 606. The IC chip comprises various circuits such as a circuit for processing a video signal, a timing pulse generating circuit, a correction circuit, a memory circuit, an operation circuit and so on on a substrate. Although two IC chips are attached in FIG. 6A, only one IC chip may be attached or a plurality of them may be attached.

Further, a constitution shown by FIG. 6B may be adopted. In FIG. 6B, portions the same as those in FIG. 6A are attached with the same notations. In this case, an example in which signal processing which is carried out by the IC chips in FIG. 6A is carried out by a logic circuit 609 formed on the same substrate by TFTs, is shown.

Further, in this case, the logic circuit 609 is constituted on the basis of a CMOS circuit similar to the driver circuits 603 and 604 and can be fabricated by an inverted stagger type TFT utilizing the present invention.

Further, the TFT utilizing the present invention can be utilized as a switching element of an EL (Electroluminescence) display device other than a switching element of an active matrix type LCD. Further, a circuit of an image sensor or the like can also be constituted by a bottom gate type TFT according to the present invention.

As described above, various electrooptical devices can be fabricated by TFTs utilizing the present invention. An electrooptical device in the present invention is defined as a device for converting an electrical signal into an optical signal or a device for converting an optical signal into an electrical signal.

In fabricating the active matrix type LCD according to the embodiment, a black matrix may be provided on the side of the opposed substrate or may be provided on the active matrix substrate (BM on TFT).

Further, a color display may be carried out by using a color filter or a constitution in which liquid crystals are driven by ECB (Electric Field Control Birefringence) mode, GH (Guest Host) mode or the like, and a color filter is may or may not be used.

Further, a constitution having a micro lens array, as in the technology disclosed in Japanese Unexamined Patent Publication No. JP-A-8-15686, may be used. The disclosure is incorporated herein by reference.

[Embodiment 7]

In this embodiment, an explanation will be given of arrangement of a seal member for sealing a liquid crystal layer in fabricating the active matrix type LCD shown in Embodiment 6.

For arranging a seal member, various constitutions, such as a constitution surrounding only the pixel matrix circuit, a constitution surrounding the driver circuit and the pixel matrix circuit and so on, are possible. Further, a narrow frame structure can be realized by installing a seal member on the driver circuit.

In the case where a seal member is provided on a driver circuit, when a conventional bottom gate structure of a channel edge type is used for a TFT, there poses a problem in which a channel forming region is directly pressed by a filler (that is a spacer for dispersing seal member) and the TFT is destroyed. In this respect, the TFT according to the present invention does not pose such a problem since the channel forming region is protected by the insulating film whose major component is silicon.

[Embodiment 8]

The active matrix type LCDs shown by Embodiments 6 and 7 are utilized as displays of various electronic devices. Further, an electronic device according for the embodiment is defined as a product mounted with an electrooptical device represented by an active matrix type LCD.

Such electronic devices, include a video camera, a still camera, a projector, a projection TV, a head mount display, a car navigation system, a personal computer (including notebook type), a portable information terminal (mobile computer, portable telephone or the like). Examples of these are shown in FIGS. 7A to 7F.

Figure 7A:
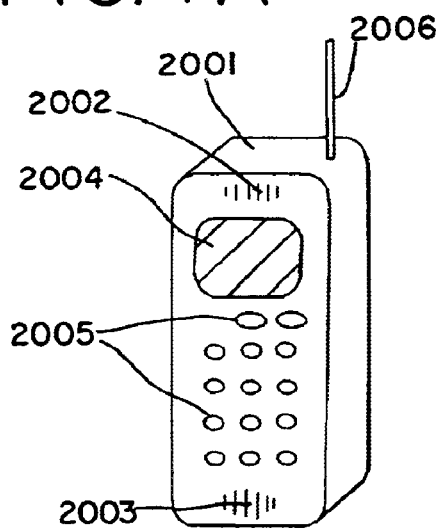
FIGS. 7A to 7F are views showing constitutions of electronic devices according to Embodiment 6.

FIG. 7A shows a portable telephone which is constituted by a main body 2001, a sound outputting unit 2002, a sound inputting unit 2003, a display device 2004, operation switches 2005 and an antenna 2006. The present invention is applicable to the display device 2004 and so on.

Figure 7B:
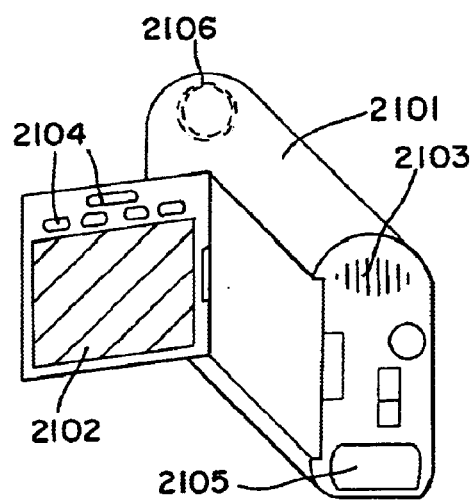

FIG. 7B shows a video camera which is constituted by a main body 2101, a display device 2102, a sound inputting unit 2103, operation switches 2104, a battery 2105 and an image receiving unit 2106. The present invention is applicable to the display device 2102.

Figure 7C:
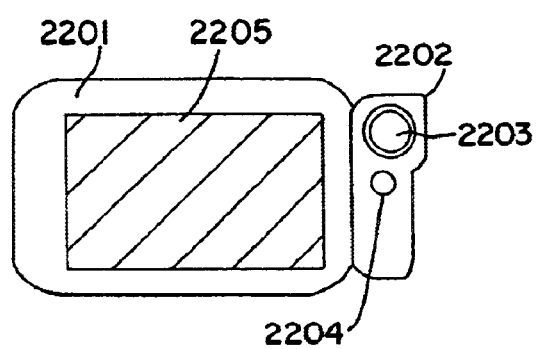

FIG. 7C shows a mobile computer which is constituted by a main body 2201, a camera unit 2202, an image receiving unit 2203, an operation switch 2204 and a display device 2205. The present invention is applicable to the display device 2205 and so on.

Figure 7D:
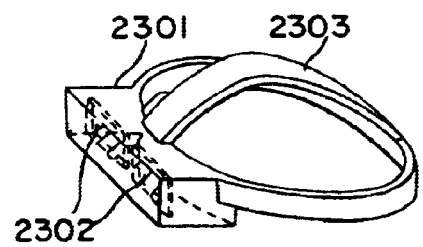

FIG. 7D shows a head mount display which is constituted by a main body 2301, a display device 2302 and a band unit 2303. The present invention is applicable to the display device 2302.

Figure 7E:
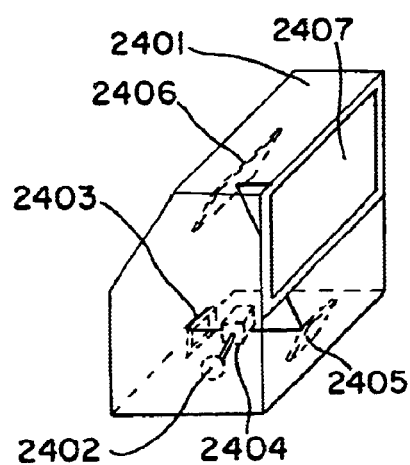

FIG. 7E shows a rear type projector which is constituted by a main body 2401, a light source 2402, a display device 2403, a polarized beam splitter 2404, reflectors 2405 and 2406 and a screen 2407. The present invention is applicable to the display device 2403.

Figure 7F:
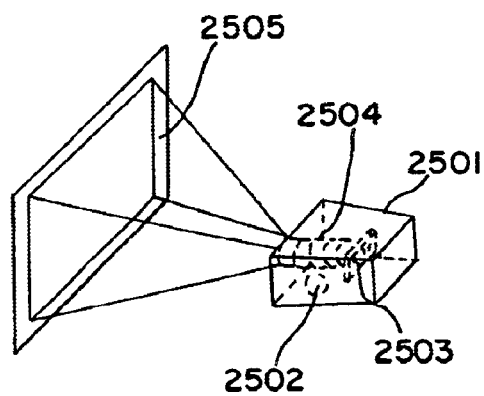

FIG. 7F shows a front type projector which is constituted by a main body 2501, a light source 2502, a display device 2503, an optical system 2504 and a screen 2505. The present invention is applicable to the display device 2503.

As mentioned above, the range for applying the present invention is extremely wide, and the present invention is applicable to electronic devices of all the fields. Further, the present invention can also be utilized in an electric light display board, a display for advertisement and so on.

[Embodiment 9]

In this embodiment, an explanation will be given of an example in which a gate electrode and a gate wiring are provided with a laminated layer structure of a Ta film having high heat resistance or a film whose major component is Ta (for example, TaN/Ta/TaN). By using a Ta film or a film whose major component is Ta in wiring material and covering the film by a protective film comprising an inorganic film (for example, silicon nitride), heating treatment at high temperatures (400 through 700° C.) can be carried out. This is effective in, for example, crystallizing an amorphous silicon film by furnace annealing. Even subjected to such a heating treatment, the temperature is within a temperature range which a gate wiring (wiring width: 0.1 through 5 $\mu$m) can withstand, the wiring is not oxidized since it is protected by the protective film, and the wiring can be maintained at low resistance.

The gate wiring and the gate electrode having the laminated layer structure include a first tantalum nitride film (TaN) formed on an insulating film, a tantalum film (Ta) formed on the tantalum nitride film, and a second tantalum nitride film (TaN) formed on the tantalum film continuously by using a sputtering process. Further, the gate wiring and the gate electrode comprising a three layer structure are formed by patterning them.

α-Ta having low resistance is formed by forming a structure in which, after forming the first TaN film (film thickness is preferably 40 nm or more), the Ta film is laminated continuously on the first TaN film.

Further, compared with the TaN film, occlusion or oxidation of hydrogen is liable to occur in the Ta film and accordingly, a structure of sandwiching the Ta film (TaN (film thickness: 50 nm)/Ta (film thickness: 250 nm)/TaN (film thickness: 50 nm)) is constituted by which an increase in resistance is prevented. In addition thereto, the TaN film is laminated as the uppermost layer to prevent the Ta film from being exposed and prevent oxidation or occlusion of hydrogen from occurring in forming a contact with other wiring to thereby provide excellent ohmic contact. Further, when a TiN film is laminated as the uppermost layer, even when the TiN film is oxidized, it does not constitute an insulating film which is preferable.

Further, in place of tantalum wiring material, for example, Mo, Nb, W, Mo—Ta alloy, Nb—Ta alloy, W—Ta alloy and so on, can be used. Further, materials produced by including nitrogen in these materials or suicides which are compounds of these materials and silicon can also be used.

Next, a protective film covering the gate electrode and comprising a silicon nitride film is formed. Since the tantalum film used in the gate film in the embodiment is liable to oxidize or occlude hydrogen, agate electrode is covered by a protective film comprising an inorganic film. Further, when high temperature treatment (for example, gettering step or the like) is carried out, the protective film restrains diffusion of impurities from a substrate, and a gate insulating film having excellent insulating performance can be maintained. In addition thereto, the protective film can prevent the gate electrode and wirings against laser beams or heat. A range of a film thickness of the protective film is preferably 10 through 100 nm.

Next, a gate insulating film is formed by covering the protective film, and later steps are carried out in accordance with Embodiments 1 through 5 by which an active matrix substrate according to the present invention is completed.

By utilizing the present invention, a bottom gate type TFT can be fabricated by steps having high mass production performance. In that case, an insulating silicon film formed to cover at least a channel forming region and end portions of an active layer, achieves the following effects.

(1) The insulating silicon film functions as a doping mask in the step of adding an impurity.

(2) The insulating silicon film prevents stepped disconnection of source and drain electrodes at the end portions of the active layer.

(3) The insulating silicon film protects the TFT (particularly, channel forming region).

Further, by fabricating an electrooptical device represented by an active matrix type LCD by using TFT of the present invention, an inexpensive product (electronic device) can be realized.

What is claimed is:

1. A semiconductor device having a plurality of thin film transistors, each of the plurality of thin film transistors having:

a gate electrode over a substrate;

an active layer comprising a semiconductor film over said gate electrode, the active layer having at least a channel forming region, source and drain regions, LDD regions, and end portions;

an insulating film over said active layer and having at least one opening, said opening located so as not to overlap with said gate electrode; and an electrode on said insulating film, said electrode connected to one of said source and drain regions through said opening, wherein said electrode is located so as to cover one of the end portions of said active layer with said insulating film interposed therebetween, and wherein inner boundaries of said opening are aligned with boundaries of said one of said source and drain regions connected with said electrode and one of said LDD regions extends to surround said one of the said source and drain regions.

2. A semiconductor device according to claim 1, wherein said gate electrode comprises laminated layers.

3. A semiconductor device according to claim 1, wherein the insulating film comprises at least one selected from the group consisting of a silicon oxide film, a silicon nitride film, and a silicon oxynitride film.

4. A semiconductor device according to claim 1, wherein the semiconductor device is a video camera.

5. A semiconductor device according to claim 1, wherein the semiconductor device is a still camera.

6. A semiconductor device according to claim 1, wherein the semiconductor device is a head mount display.

7. A semiconductor device according to claim 1, wherein the semiconductor device is a car navigation system.

8. A semiconductor device according to claim 1, wherein the semiconductor device is a mobile computer.

9. A semiconductor device according to claim 1, wherein the semiconductor device is a portable telephone.

10. A semiconductor device according to claim 1, wherein the semiconductor device is a rear type projector.

11. A semiconductor device according to claim 1, wherein the semiconductor device is a front type projector.

12. A semiconductor device according to claim 1, wherein said semiconductor film comprises silicon germanium.

13. A semiconductor device according to claim 1, wherein said gate electrode comprises at least one material selected from the group consisting of Ta, Mo, Nb, and W.

14. A semiconductor device according to claim 1, wherein said end portions have a same impurity concentration as said LDD regions.

15. A semiconductor device having a plurality of thin film transistors, each of the plurality of thin film transistors having:

a gate electrode over a substrate;

an active layer comprising a semiconductor film over said gate electrode, said active layer having at least a channel forming region, source and drain regions, LDD regions and end portions;

an insulating film over said active layer and having at least one opening located so as not to overlap with said gate electrode; and an electrode on said insulating film, said electrode connected to one of said source and drain regions through said opening, wherein said electrode is located so as to cover one of the end portions of said active layer with said insulating film interposed therebetween, wherein inner boundaries of said opening are aligned with boundaries of said one of said source and drain regions connected with said electrode, and wherein said end portions have a same impurity concentration as said LDD regions and one of said LDD regions extends to surround said one of the said source and drain regions.

16. A semiconductor device according to claim 15, wherein the insulating film is comprises at least one selected from the group consisting of a silicon oxide film, a silicon nitride film, and a silicon oxynitride film.

17. A semiconductor device according to claim 15, wherein the semiconductor device is one selected from the group consisting of a video camera, a still camera, a head mount display, a car navigation system, a mobile computer, a portable telephone, a rear type projector, and a front type projector.

18. A semiconductor device according to claim 15, wherein said semiconductor film comprises silicon germanium.

19. A semiconductor device according to claim 15, wherein said gate electrode comprises laminated layers.

20. A semiconductor device according to claim 15, wherein said gate electrode comprises at least one material selected from the group consisting of Ta, Mo, Nb, and W.

21. A semiconductor device having a plurality of thin film transistors, each of the plurality of thin film transistors comprising:

at least one gate electrode on an insulating surface over a substrate;

an active layer comprising a semiconductor film over said gate electrode, the active layer having at least a channel forming region, source and drain regions, LDD regions, and end portions, and said source and drain regions located so as not to overlap with said gate electrode; and an insulating film covering at least the channel forming region, the LDD regions and the end portions of the active layer, said insulating film having at least an opening; and an electrode on said insulating film, said electrode connected to one of said source and drain regions through said opening, wherein said electrode is located so as to cover one of said end portions of said active layer with said insulating film interposed therebetween; and wherein inner boundaries of said opening are aligned with boundaries of said one of said source and drain regions connected with said electrode and one of said LDD regions extends to surround said one of said source and drain regions.

22. A semiconductor device according to claim 21, wherein the insulating film is comprises at least one selected from the group consisting of a silicon oxide film, a silicon nitride film, and a silicon oxynitride film.

23. A semiconductor device according to claim 21, wherein the semiconductor device is one selected from the group consisting of a video camera, a still camera, a head mount display, a car navigation system, a mobile computer, a portable telephone, a rear type projector, and a front type projector.

24. A semiconductor device according to claim 21, wherein said semiconductor film comprises silicon germanium.

25. A semiconductor device according to claim 21, wherein said gate electrode comprises laminated layers.

26. A semiconductor device according to claim 21, wherein said gate electrode comprises at least one material selected from the group consisting of Ta, Mo, Nb, and W.

27. A semiconductor device according to claim 21, wherein said end portions have a same impurity concentration as said LDD regions.

28. A semiconductor device comprising at least one NTFT and at least one PTFT, each of the NTFT and the PTFT comprising:
   a gate electrode on an insulating surface over a substrate;
   an active layer comprising a semiconductor film over the gate electrode, the active layer having at least a channel forming region, source and drain regions, and end portions, the source and drain regions located so as not to overlap with said gate electrode;
   an insulating film over said active layer and having at least one opening;
   an electrode on said insulating film, said electrode connected to one of said source and drain regions through said opening; and
   an interlayer insulating film over said insulating film and said electrode,
   wherein said electrode is located so as to cover one of the end portions of said active layer with said insulating film interposed therebetween,
   wherein the active layer of the NTFT further comprises LDD regions and said channel forming region and portions of the LDD regions are located so as to overlap with said gate electrode, and
   wherein inner boundaries of said opening are aligned with boundaries of said one of said source and drain regions connected with said electrode and one of said LDD regions extends to surround said one of said source and drain regions.

29. A semiconductor device according to claim 28, wherein the insulating film is comprises at least one selected from the group consisting of a silicon oxide film, a silicon nitride film, and a silicon oxynitride film.

30. A semiconductor device according to claim 28, wherein the semiconductor device has an electroluminescence display.

31. A semiconductor device according to claim 28, wherein the semiconductor device is one selected from the group consisting of a video camera, a still camera, a head mount display, a car navigation system, a mobile computer, a portable telephone, a rear type projector, and a front type projector.

32. A semiconductor device according to claim 28, wherein said semiconductor film comprises silicon germanium.

33. A semiconductor device according to claim 28, wherein said gate electrode comprises laminated layers.

34. A semiconductor device according to claim 28, wherein said gate electrode comprises at least one material selected from the group consisting of Ta, Mo, Nb, and W.

35. A semiconductor device according to claim 28, wherein said end portions have a same impurity concentration as said LDD regions.

36. A semiconductor device comprising:
   a gate electrode on an insulating surface over a substrate;
   an active layer comprising a semiconductor film over the gate electrode with a gate insulating film interposed therebetween, the active layer having at least a channel forming region, source and drain regions, LDD regions, and end portions, and said source and drain regions located so as not to overlap with said gate electrode;
   an insulating film covering the channel forming region, the LDD regions, and the end portions of the active layer, said insulating film having openings;
   source and drain electrodes on said insulating film, said source and drain electrodes connected to said source and drain regions through said openings, respectively;
   an interlayer insulating film over said insulating film and said source and drain electrodes; and
   a pixel electrode formed on said interlayer insulating film, said pixel electrode electrically connected to one of said source and drain regions,
   wherein at least one of said source and drain electrodes is located so as to cover an one of end portions of said active layer with said insulating film interposed therebetween,
   wherein inner boundaries of one of said openings are aligned with boundaries of said one of said source and drain regions and one of said LDD regions extends to surround said one of said source and drain regions, and
   wherein the source and drain electrodes are not contact with the gate insulating film.

37. A semiconductor device according to claim 36, wherein the insulating film comprises at least one selected from the group consisting of a silicon oxide film, a silicon nitride film, and a silicon oxynitride film.

38. A semiconductor device according to claim 36, wherein the semiconductor device has an electroluminescence display.

39. A semiconductor device according to claim 36, wherein the semiconductor device is one selected from the group consisting of a video camera, a still camera, a head mount display, a car navigation system, a mobile computer, a portable telephone, a rear type projector, and a front type projector.

40. A semiconductor device according to claim 36, wherein said semiconductor film comprises silicon germanium.

41. A semiconductor device according to claim 36, wherein said gate electrode comprises at least one material selected from the group consisting of Ta, Mo, Nb, and W.

42. A semiconductor device according to claim 36, wherein said end portions have a same impurity concentration as said LDD regions.

43. A semiconductor device according to claim 36, wherein said gate electrode comprises laminated layers.

44. A semiconductor device having an electroluminescence display device formed over a substrate and comprising a plurality of thin film transistors, each of said plurality of thin film transistors comprising:
   at least one gate electrode on an insulating surface over the substrate;
   an active layer comprising a semiconductor film over said gate electrode, the active layer having at least a channel forming region, a pair of first impurity regions, a pair of second impurity regions and end portions; and
   an insulating film covering at least the channel forming region and said end portions, and said pair of second impurity regions, said insulating film having at least one opening, said opening located so as not to overlap with said gate electrode; and
   an electrode on said insulating film, said electrode connected to one of said pair of first impurity regions through said opening,
   wherein said pair of first impurity regions and said pair of second impurity regions include the same impurity for giving one type of conductivity and an impurity concentration of said pair of first impurity regions is higher than that of said pair of second impurity regions,
   wherein said electrode is located so as to cover one of the end portions of said active layer with said insulating film interposed therebetween, and wherein inner boundaries of said opening are aligned with boundaries of said one of said pair of first impurity regions connected with said electrode and one of said pair of second impurity regions extends to surround said one of said pair of first impurity regions.

45. A semiconductor device according to claim 44, wherein the insulating film comprises at least one material selected from the group consisting of silicon oxide, silicon nitride, and silicon oxynitride.

46. A semiconductor device according to claim 44, wherein the semiconductor is one selected film the group consisting of a video camera, a still camera, a head mount display, a car navigation system, a mobile computer, a portable telephone, a rear type projector, and a front type projector.

47. A semiconductor device according to claim 44, wherein said semiconductor film comprises silicon germanium.

48. A semiconductor device according to claim 44, wherein said gate electrode comprises laminated layers.

49. A semiconductor device according to claim 44, wherein said gate electrode comprises at least one material selected from the group consisting of Ta, Mo, Nb, and W.

50. A semiconductor device according to claim 44, wherein said end portions have a same impurity concentration as a said pair of second impurity regions.

51. A semiconductor device having an electroluminescence display device formed over a substrate and comprising a plurality of thin film transistors, each of said plurality of thin film transistors comprising:
    at least one gate electrode on an insulating surface over said substrate;
    an active layer comprising a semiconductor film over said gate electrode, the active layer having at least a channel forming region, first impurity regions, second impurity regions, and end portions, and said channel forming region and portions of the second impurity regions are located so as to overlap with said gate electrode;
    an insulating film over said channel forming region and the second impurity regions of the active layer and having at least one opening; and
    an electrode on said insulating film, said electrode connected to one of said first impurity regions through said opening,
    wherein said first impurity regions and said second impurity regions include the same impurity for giving one type of conductivity and an impurity concentration of said first impurity regions is higher than that of said second impurity regions,
    wherein said electrode is located so as to cover one of the end portions of said active layer with said insulating film interposed therebetween, and
    wherein inner boundaries of said opening are aligned with boundaries of said one of said first impurity regions connected with said electrode and one of said second impurity regions extends to surround said one of said first impurity regions.

52. A semiconductor device according to claim 51, wherein the insulating film comprises at least one material selected from the group consisting of silicon oxide, silicon nitride, and silicon oxynitride.

53. A semiconductor device according to claim 51, wherein the semiconductor device is one selected from the group consisting of a video camera, a still camera, a head mount display, a car navigation system, a mobile computer, a portable telephone, a rear type projector, and a front type projector.

54. A semiconductor device according to claim 51, wherein said semiconductor film comprises silicon germanium.

55. A semiconductor device according to claim 51, wherein said gate electrode comprises laminated layers.

56. A semiconductor device according to claim 51, wherein said gate electrode comprises at least one material selected from the group consisting of Ta, Mo, Nb, and W.

57. A semiconductor device according to claim 51, wherein said end portions have a same impurity concentration as said second impurity regions.

58. A semiconductor device having an electroluminescence display device formed over a substrate and comprising a plurality of thin film transistors, each of said plurality of thin film transistors comprising:
    at least one gate electrode on an insulating surface over said substrate;
    an active layer comprising a semiconductor film over said gate electrode, said active layer having at least a channel forming region, source and drain regions, LDD regions and end portions;
    an insulating film covering at least the channel forming region, the LDD regions and the end portions of the active layer, said insulating film having at least one opening, which is located so as not to overlap with said gate electrode; and
    an electrode on said insulating film, said electrode connected to one of said source and drain regions through said opening,
    wherein said electrode is located so as to cover at least one of said end portions of said active layer with said insulating film interposed therebetween; and
    wherein inner boundaries of said opening are aligned with boundaries of said one of said source and drain regions connected with said electrode and one of said LDD regions extends to surround said one of said source and drain regions.

59. A semiconductor device according to claim 58, wherein the insulating film comprises at least one material selected from the group consisting of silicon oxide, silicon nitride, and silicon oxynitride.

60. A semiconductor device according to claim 58, wherein the semiconductor device is one electric device is one selected from the group consisting of a video camera, a still camera, a head mount display, a car navigation system, a mobile computer, a portable telephone, a rear type projector, and a front type projector.

61. A semiconductor device according to claim 58, wherein said semiconductor film comprises silicon germanium.

62. A semiconductor device according to claim 58, wherein said gate electrode comprises laminated layers.

63. A semiconductor device according to claim 58, wherein said gate electrode comprises at least one material selected from the group consisting of Ta, Mo, Nb, and W.

64. A semiconductor device according to claim 58, wherein said end portions have a same impurity concentration as said LDD regions.

65. A semiconductor device comprising:
    a gate electrode on an insulating surface over a substrate;
    an active layer comprising a semiconductor film over the gate electrode with a gate insulating film interposed therebetween, the active layer having at least a channel forming region, source and drain regions, LDD regions and end portion, and said source and drain regions located so as not to overlap with said gate electrode;

an insulating film covering the channel forming region, the LDD regions and the end portions of the active layer, said insulating film having openings;

source and drain electrodes on said insulating film, said source and drain electrodes connected to said source and drain regions through said openings, respectively;

an interlayer insulating film over said insulating film and said source and drain electrodes; and a pixel electrode formed on said interlayer insulating film, said pixel electrode electrically connected to one of said source and drain regions, wherein at least one of said source and drain electrodes is located so as to cover one of said end portions of said active layer with said insulating film interposed therebetween, wherein inner boundaries of one of said openings are aligned with boundaries of said one of said source and drain regions and one of said LDD regions extends to surround said one of said source and drain regions, and wherein the source and drain electrodes are not in contact with the gate insulating film.

66. A semiconductor device according to claim 65, wherein the insulating film comprises at least one selected from the group consisting of a silicon oxide film, a silicon nitride film, and a silicon oxynitride film.

67. A semiconductor device according to claim 65, wherein the semiconductor device has an electroluminescence display.

68. A semiconductor device according to claim 65, wherein the semiconductor device is one selected from the group consisting of a video camera, a still camera, a head mount display, a car navigation system, a mobile computer, a portable telephone, a rear type projector, and a front type projector.

69. A semiconductor device according to claim 65, wherein said semiconductor film comprises silicon germanium.

70. A semiconductor device according to claim 65, wherein said gate electrode comprises at least one material selected from the group consisting of Ta, Mo, Nb, and W.

71. A semiconductor device according to claim 65, wherein said gate electrode comprises laminated layers.

72. A semiconductor device according to claim 65, wherein said end portions have a same impurity concentration as said LDD regions.

73. A semiconductor device comprising:

a gate electrode on an insulating surface over a substrate;

an active layer comprising a semiconductor film over the gate electrode with a gate insulating film interposed therebetween, the active layer having at least a channel forming region, source and drain regions, LDD regions and end portions, and said source and drain regions located so as not to overlap with said gate electrode;

an insulating film covering the channel forming region, the LDD regions and the end portions of the active layer, said insulating film having openings;

source and drain electrodes on said insulating film, said source and drain electrodes connected to said source and drain regions through said openings, respectively;

an interlayer insulating film over said insulating film and said source and drain electrodes; and a pixel electrode formed on said interlayer insulating film, said pixel electrode electrically connected to one of said source and drain regions, wherein at least one of said source and drain electrodes is located so as to cover one of said end portions of said active layer with said insulating film interposed therebetween, wherein inner boundaries of one of said opening openings are aligned with boundaries of said one of said source and drain regions and one of said LDD regions extends to surround said one of said source and drain regions, and wherein the source and drain electrodes are not in contact with the gate insulating film.

74. A semiconductor device according to claim 73, wherein the insulating film is comprises at least one selected from the group consisting of a silicon oxide film, a silicon nitride film, and a silicon oxynitride film.

75. A semiconductor device according to claim 73, wherein the semiconductor device has an electroluminescence display.

76. A semiconductor device according to claim 73, wherein the semiconductor device is one selected from the group consisting of a video camera, a still camera, a head mount display, a car navigation system, a mobile computer, a portable telephone, a rear type projector, and a front type projector.

77. A semiconductor device according to claim 73, wherein said semiconductor film comprises silicon germanium.

78. A semiconductor device according to claim 73, wherein said gate electrode comprises at least one material selected from the group consisting of Ta, Mo, Nb, and W.

79. A semiconductor device according to claim 73, wherein said gate electrode comprises laminated layers.

80. A semiconductor device according to claim 73, wherein said end portions have a same impurity concentration as said LDD regions.

* * * * *